(12) United States Patent
Mokhna Rau et al.

(10) Patent No.: US 10,586,801 B2
(45) Date of Patent: Mar. 10, 2020

(54) FLASH MEMORY CELLS

(71) Applicant: Intel Corporation, Santa Clara, CA (US)

(72) Inventors: Prakash Rau Mokhna Rau, Boise, ID (US); Wesly McKinsey, Nampa, ID (US); Rithu Bhonsle, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/870,735

(22) Filed: Jan. 12, 2018

(65) Prior Publication Data

US 2019/0043871 A1     Feb. 7, 2019

(51) Int. Cl.
*H01L 27/11524*     (2017.01)
*H01L 27/11551*     (2017.01)
*H01L 27/11556*     (2017.01)
*B82Y 40/00*     (2011.01)
*B82Y 10/00*     (2011.01)

(52) U.S. Cl.
CPC .. *H01L 27/11524* (2013.01); *H01L 27/11551* (2013.01); *H01L 27/11556* (2013.01); *B82Y 10/00* (2013.01); *B82Y 40/00* (2013.01); *H01L 2924/1438* (2013.01)

(58) Field of Classification Search
CPC ................... H01L 27/11524; H01L 27/11551
See application file for complete search history.

(56) References Cited

U.S. PATENT DOCUMENTS

| | | |
|---|---|---|
| 6,291,360 B1 | 9/2001 | Moon |
| 6,630,390 B2 | 10/2003 | Andideh et al. |
| 6,734,096 B2 | 5/2004 | Dalton et al. |
| 6,858,153 B2 | 2/2005 | Bjorkman et al. |
| 6,962,869 B1 | 11/2005 | Bao et al. |
| 7,049,209 B1 | 5/2006 | Dalton et al. |
| 7,061,068 B2 | 6/2006 | Pipes et al. |
| 7,084,042 B2 | 8/2006 | Olewine et al. |
| 7,205,248 B2 | 4/2007 | Li et al. |
| 7,253,105 B2 | 8/2007 | Dimitrakopoulos et al. |

(Continued)

FOREIGN PATENT DOCUMENTS

TW     346648 B     12/1998

OTHER PUBLICATIONS

Borst et al.; "Chemical-mechanical polishing of SiOC organosilicate glasses: the effect of film carbon content"; Thin Solid Films; (Apr. 2, 2001); pp. 281-292; vol. 385, Issues 1-2; <doi: 10.1016/S0040-6090(00)01925-8 >.

(Continued)

*Primary Examiner* — Allison Bernstein
(74) *Attorney, Agent, or Firm* — Thorpe North & Western, LLP; David W. Osborne

(57) ABSTRACT

3D NAND memory cells can include a source layer, a dielectric layer disposed on the source layer, and a select gate source (SGS) layer disposed on the dielectric layer. A plurality of alternating layers of conducting material and insulating material can be disposed on the SGS layer. A conductive channel can be formed within a cell pillar trench. The conductive channel can be in contact with the source layer and the plurality of alternating layers. The cell pillar trench can be positioned in a substantially perpendicular orientation with respect to the plurality of alternating layers.

18 Claims, 7 Drawing Sheets

(56) References Cited

U.S. PATENT DOCUMENTS

| | | | |
|---|---|---|---|
| 7,572,732 B2 | 8/2009 | Goodner et al. | |
| 8,232,148 B2 | 7/2012 | Li et al. | |
| 8,637,403 B2 | 1/2014 | Amoah et al. | |
| 9,343,469 B2* | 5/2016 | Sun | H01L 29/7889 |
| 9,666,590 B2* | 5/2017 | Chien | H01L 27/11556 |
| 9,672,918 B2* | 6/2017 | Hashimoto | G11C 16/08 |
| 2003/0139051 A1 | 7/2003 | Andideh et al. | |
| 2003/0183252 A1 | 10/2003 | Timperio et al. | |
| 2004/0152342 A1 | 8/2004 | Li et al. | |
| 2004/0155341 A1 | 8/2004 | Pipes et al. | |
| 2008/0149884 A1 | 6/2008 | Siddiqui et al. | |
| 2013/0147067 A1 | 6/2013 | Amoah et al. | |
| 2014/0167131 A1* | 6/2014 | Lu | H01L 29/7889 |
| | | | 257/316 |

OTHER PUBLICATIONS

Wang et al.; "Modeling the effects of abrasive size, surface oxidizer concentration and binding energy on chemical mechanical polishing at molecular scale"; Tribology International; (Mar. 2008); pp. 202-210; vol. 41, Issue 3; <doi: 10.1016/j.triboint.2007.08.004 >.

* cited by examiner

FLASH MEMORY CELLS

BACKGROUND

Semiconductor materials (e.g., polysilicon) are used to form electrical conduits, or channels in a variety of electronic devices, for example, devices that employ complimentary metal-oxide-semiconductor (CMOS) materials. CMOS technology is used in numerous electronic devices and components, including microprocessors, microcontrollers, computer memory, and digital logic circuits.

Various computer memory types, such as static random access memory (SRAM) and flash memory (e.g., NOR, NAND, and charge trap), utilize CMOS materials and have architecture that electrically couples a source line to an array of memory cells. Typically, memory cells in flash memory arrays are arranged such that a control gate of each memory cell in a row of the array is connected to form an access line, such as a word line. Columns of the array include strings of memory cells connected source to drain, between a pair of select lines, a source select line and a drain select line.

Flash memory arrays may be in two-dimensional configurations or three-dimensional (3D) configurations (e.g., stacked memory arrays including pillars of stacked memory elements, such as vertical NAND strings). The source select line includes a source select gate at each intersection between a memory cell string and the source select line, and the drain select line includes a drain select gate at each intersection between a memory cell string and the drain select line. Each source select gate is connected to a source line, while each drain select gate is connected to a data line, such as a column bit line. Typically, the source line and the data line are formed of polysilicon and the memory cells are connected via a polysilicon channel, which is electrically coupled to the source and data lines.

DESCRIPTION OF EMBODIMENTS

Figure 1:
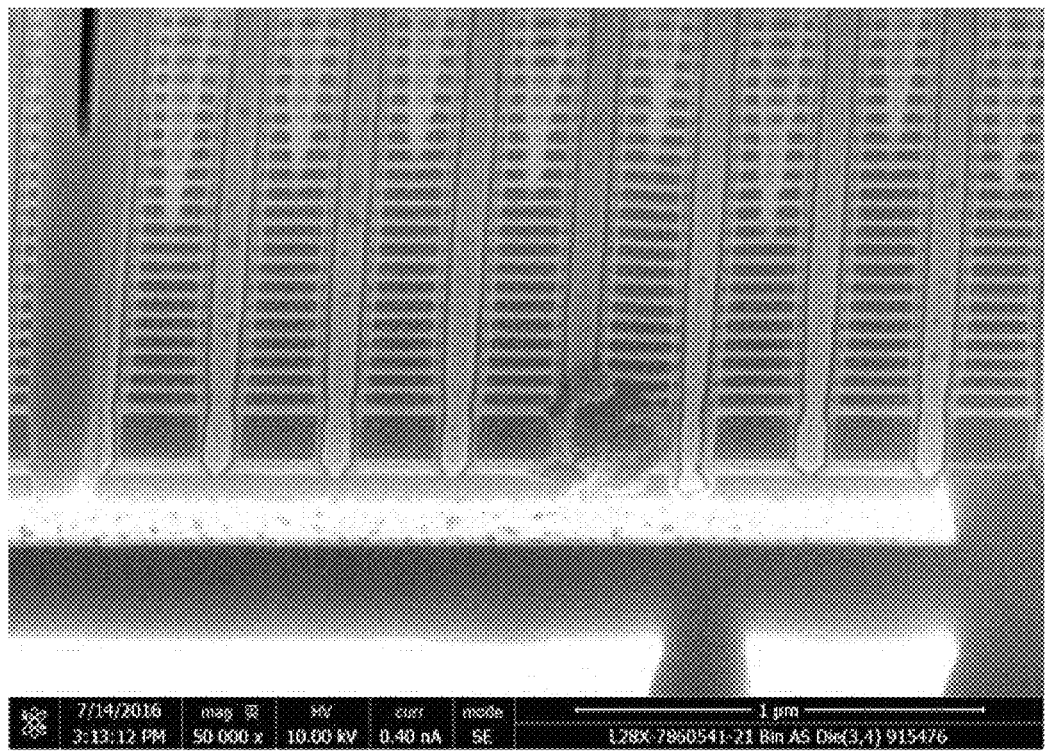
FIG. 1 is an SEM image of a segment of 3D NAND memory cell, in accordance with an example.

Although the following detailed description contains many specifics for the purpose of illustration, a person of ordinary skill in the art will appreciate that many variations and alterations to the following details can be made and are considered to be included herein. Accordingly, the following embodiments are set forth without any loss of generality to, and without imposing limitations upon, any claims set forth. It is also to be understood that the terminology used herein is for the purpose of describing particular embodiments only, and is not intended to be limiting. Unless defined otherwise, all technical and scientific terms used herein have the same meaning as commonly understood by one of ordinary skill in the art to which this disclosure belongs.

As used in this written description, the singular forms "a," "an" and "the" include express support for plural referents unless the context clearly dictates otherwise. Thus, for example, reference to "a layer" includes a plurality of such layers.

In this application, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open ended term, like "comprising" or "including," in this written description it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

The term "coupled," as used herein, is defined as directly or indirectly connected in an electrical or nonelectrical manner. "Directly coupled" objects, structures, or elements are in physical contact with one another and are attached. Objects described herein as being "adjacent to" each other may be in physical contact with each other, in close proximity to each other, or in the same general region or area as each other, as appropriate for the context in which the phrase is used.

Occurrences of the phrase "in one embodiment," or "in one aspect," herein do not necessarily all refer to the same embodiment or aspect.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. Unless otherwise stated, use of the term "about" in accordance with a specific number or numerical range should also be understood to provide support for such numerical terms or range without the term "about". For example, for the sake of convenience and brevity, a numerical range of "about 50 angstroms to about 80 angstroms" should also be understood to provide support for the range of "50 angstroms to 80 angstroms." Furthermore, it is to be understood that in this specification support for actual numerical values is provided even when the term "about" is used therewith. For example, the recitation of "about" 30 should be construed as not only providing support for values a little above and a little below 30, but also for the actual numerical value of 30 as well.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

EXAMPLE EMBODIMENTS

An initial overview of invention embodiments is provided below and specific embodiments are then described in further detail. This initial summary is intended to aid readers in understanding the technological concepts more quickly, but is not intended to identify key or essential features thereof, nor is it intended to limit the scope of the claimed subject matter.

The present technology pertains to computer memory including flash memory, such as three-dimensional (3D) flash memory cells, flash memory structures, computing systems, and associated methods. Flash memory is a memory technology that utilizes a plurality of memory cells arranged in some form of an array, where each memory cell is capable of storing binary data. A typical memory cell resembles a field-effect transistor (FET) having a conductive floating (i.e. electrically isolated) gate that controls the electrical conduction of a charge carrier channel between the source and drain regions of the memory cell. More specifically, the floating gate is positioned between the control gate and the channel of a metal-oxide silicon FET (MOSFET), and a non-conductive material (e.g. a nitride) facilitates charge storage between the control gate and the charge carrier channel. The stored data is represented by the amount of charge on the floating gate, and as such, the electrical resistance between the source and the drain can be used to read the binary value stored in the floating gate.

One example of a flash architecture is NAND flash, which in general comprises multiple memory cells connected in an arrangement similar to a NAND gate. In one embodiment, a group or string of memory cells are connected in series, source to drain, such that each control gate is coupled to a word line (WL). Select gates can couple the string of memory cells to a source line at one end and to a bit line (BL) at the other end. In one example of a 3D flash array, multiple strings of memory cells can be arranged around a conductive pillar, such that in each string of memory cells, the source, channel, and drain are arranged along the length of the pillar. In one architectural arrangement, these vertical NAND strings can be coupled at the bottom end to a source line via a select gate source (SGS), and at the top end to a BL via a select gate drain (SGD).

Generally, it can be desirable to maintain the source line and the SGS layer in relatively close proximity. For example, in some cases, dopants need to be up-diffused through the conductive pillar or channel to be able to turn on the memory cell. If the distance between the source line and the SGS becomes too large, it can require more dopant and higher diffusion temperatures to adequately up-diffuse the dopant. Further, the larger distance can also generate a larger field effect when the cell is turned on that can interfere with other local cells.

Accordingly, the present disclosure is directed to memory cells, memory structures, systems, and associated methods that can help overcome the challenges described above. For example, 3D NAND memory cells can include a source layer, a dielectric layer disposed on the source layer, and a select gate source (SGS) layer disposed on the dielectric layer. A plurality of alternating layers of conducting material and insulating material can be disposed on the SGS layer. The plurality of alternating layers can have an SGS end proximate the SGS layer and a drain end distal to the SGS layer. A conductive channel can be formed within a cell pillar trench. The conductive channel can be in contact with the source layer and the plurality of alternating layers. The cell pillar trench can be positioned in a substantially perpendicular orientation with respect to the plurality of alternating layers and can have a diameter that differs by no more than 20% along a length thereof from the drain end to the SGS end of the plurality of alternating layers.

In some examples, flash memory structures can include a source layer, a dielectric layer disposed on the source layer, and a select gate source (SGS) layer disposed on the dielectric layer. A plurality of alternating layers of conducting material and insulating material can be disposed on the SGS layer. The plurality of alternating layers can have an SGS end proximate the SGS layer and a drain end distal to the SGS layer. A conductive channel can be formed within a cell pillar trench. The conductive channel can be in contact with the source layer and the plurality of alternating layers. The cell pillar trench can be positioned in a substantially perpendicular orientation with respect to the plurality of alternating layers and can have a diameter that differs by no more than 20% along a length thereof from the drain end to the SGS end of the plurality of alternating layers. The flash memory structure can also include an array of memory structures arranged in a three-dimensional configuration around the conductive channel. The memory structures can be aligned with and electrically coupled to the conductive material layers. A computing system can include a motherboard and a flash memory structure as described herein that is operably coupled to the motherboard.

Methods of fabricating a 3D NAND memory cell can include forming a source layer, a dielectric layer on the source layer, and a select gate source (SGS) layer on the dielectric layer. In some examples, the method can also include forming a plug trench through a region of the SGS layer and the dielectric layer and depositing an etch-stop material within the plug trench to form a plug. In some examples, the method can also include forming a plurality of alternating layers of conductive material and insulating material on the SGS layer and etching a cell pillar trench through a region of the plurality of alternating layers to impinge on the plug. Additionally, in some examples, the method can include removing the plug from the plug trench and forming a conductive channel contacting the source layer and the plurality of alternating layers.

Methods of maintaining a uniform cell pillar trench diameter in a 3D NAND memory cell can include forming a source layer, a dielectric layer on the source layer, and a select gate source (SGS) layer on the dielectric layer. In some examples, the method can further include forming a plug trench through a region of the SGS layer and the dielectric layer and depositing an etch-stop material within the plug trench to form a plug. In some examples, the method can also include forming a plurality of alternating layers of conductive material and insulating material on the SGS layer. The plurality of alternating layers can have an SGS end proximate the SGS layer and a drain end distal to the SGS layer. In some examples, the method can also include etching a cell pillar trench through a region of the plurality of alternating layers to impinge on the plug. In some cases, the cell pillar trench can be positioned in a substantially perpendicular orientation with respect to the plurality of alternating layers and can have a diameter that differs by no more than 20% along a length thereof from the drain end to the SGS end of the plurality of alternating layers. The method can also include removing the plug from the plug trench.

Flash memory cells and memory structures as described herein can be fabricated in a number of ways. The fabrication process generally includes the use of an etch-stop material that can allow close proximity between the source layer and the SGS layer as well as a substantially uniform diameter of the pillar trench. In further detail, the etch-stop material can substitute for a blanket etch-stop layer in the flash memory stack. Thus, etch-stop material can be made as thick as desired prior to removal while maintaining other layers in the stack at optimal thicknesses for optimal performance of the device. Further, by implementing a step to deposit an etch-stop material in the SGS layer, the SGS layer can be printed/etched in a more controlled manner than during a general pillar etch. As such, the diameter of the pillar trench, or segments thereof, can also be more uniform by employing a plug as an etch-stop material rather than a blanket etch-stop layer. However, it is noted that some plug materials can cause oxidation and shorting of the source layer, as illustrated in FIG. 1. As such, the present disclosure also describes a number of suitable plug materials that can be used in the fabrication processes described herein.

Figure 2:
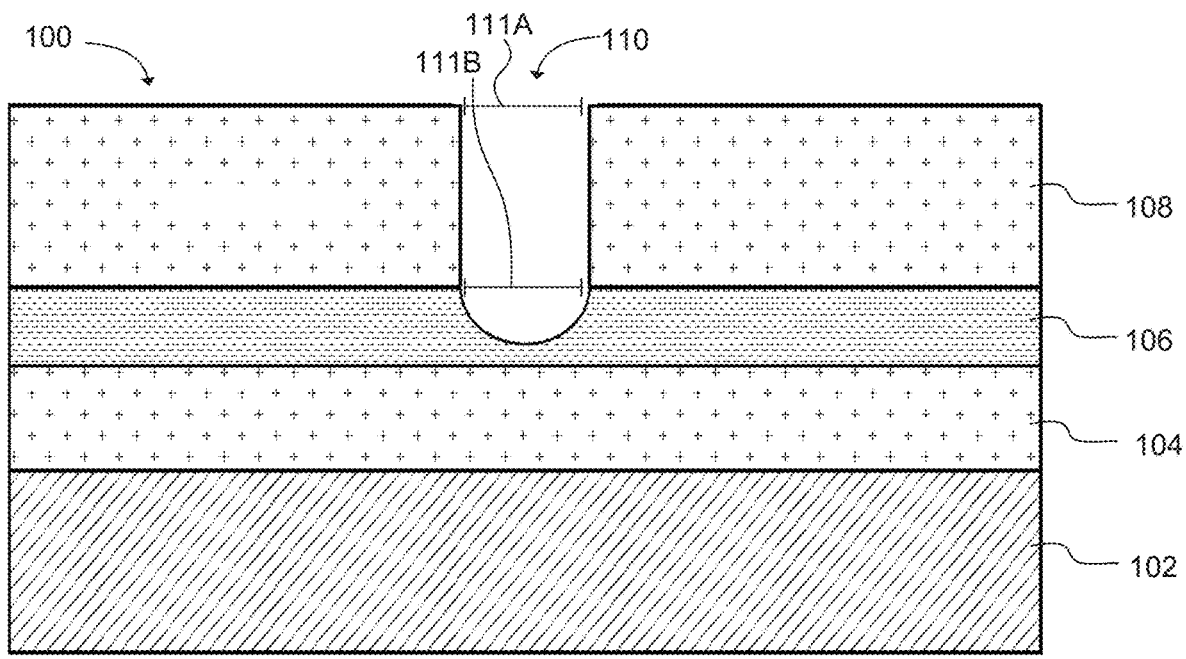
FIG. 2 illustrates a flash memory cell or flash memory structure at a point during fabrication thereof, in accordance with an example.

FIGS. 2-10 show a flash memory cell or flash memory structure at a series of points during the manufacturing process according to some examples of the present disclosure. Unless otherwise noted, techniques for manufacturing the various structural elements of the memory cells or structures are well known, and would be readily apparent to one of ordinary skill in the art once in possession of the present specification. A flash memory stack 100 is illustrated in FIG. 2 as having a substrate 102, a source layer 104, a dielectric layer 106, and a select gate source (SGS) layer 108 as the foundation for a flash memory cell or memory structure. Further, as illustrated in FIG. 2, the flash memory stack 100 can be further shaped to include a plug trench 110. The plug trench 110 can be formed through a region of the SGS layer 108 and the dielectric layer 106. As will be appreciated by one skilled in the art, the plug trench 110 can be formed in a number of ways, such as by using a mask (e.g. an optical mask) and subsequent etching process (e.g. a dry etching process, wet etching process, or a combination thereof) to achieve a desired geometry for the plug trench 110. This can be a highly controlled process, such that a diameter 111A of the plug trench 110 at the top of the SGS layer 108 and a diameter 111B at the bottom of the SGS layer 108 are substantially equivalent. In some specific examples, the diameter 111A of the plug trench 110 at the top of the SGS layer 108 can be within about 5 nm, 3 nm, or 2 nm of the diameter 111B of the plug trench 110 at the bottom of the SGS layer 108. In some specific examples, diameter 111A, 111B, or both can have a diameter of from about 80 nm to about 120 nm, or from about 90 nm to about 110 nm.

Figure 3:
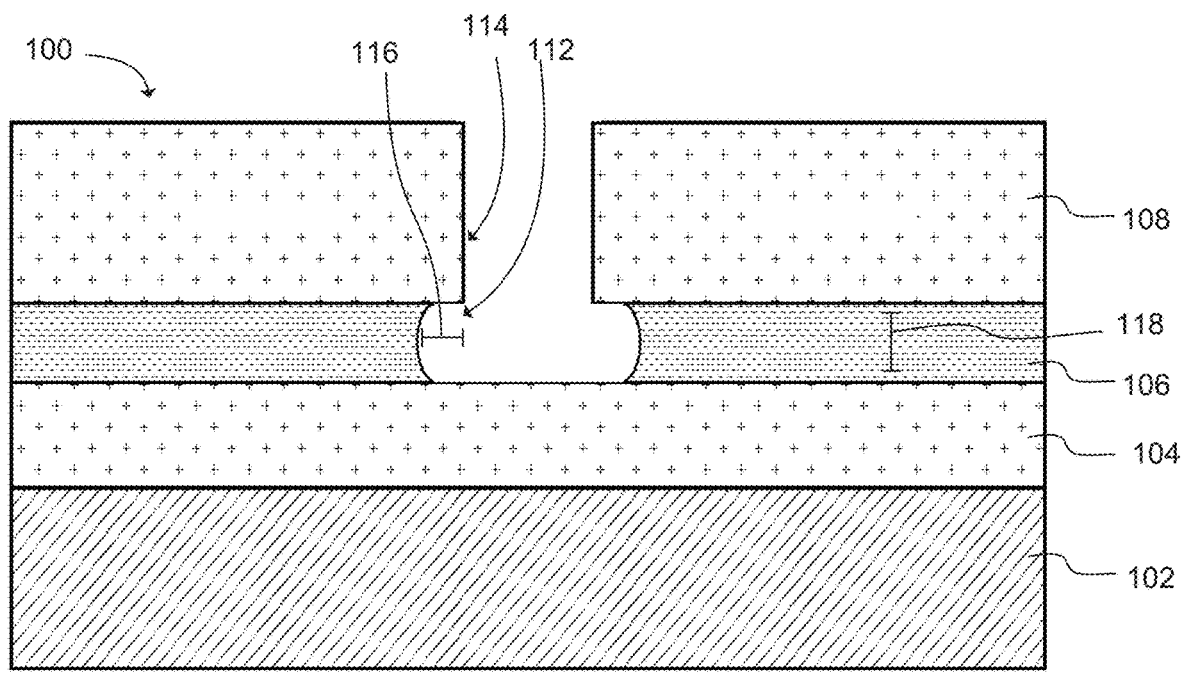
FIG. 3 illustrates a flash memory cell or flash memory structure at another point during fabrication thereof, in accordance with an example.

In some further examples, as illustrated in FIG. 3, forming the plug trench 110 can further include forming a lateral recess 112 extending laterally from a trench wall 114 of the SGS layer 108 within the dielectric layer 106. In some examples, the lateral recess 112 can be formed by a wet etching process. In some further examples, the lateral recess 112 can extend from the trench wall 114 into the dielectric layer 106 a distance 116 that is about 0.2 times to about 0.6 times the thickness 118 of the dielectric layer 106. In some further examples, the lateral recess 112 can extend from the trench wall 114 into the dielectric layer 106 a distance 116 that is about 0.3 times to about 0.4 times the thickness 118 of the dielectric layer 106. In some specific examples, the lateral recess 112 can extend from the trench wall 114 into the dielectric layer 106 a distance 116 of from about 15 nm to about 20 nm.

Figure 4:
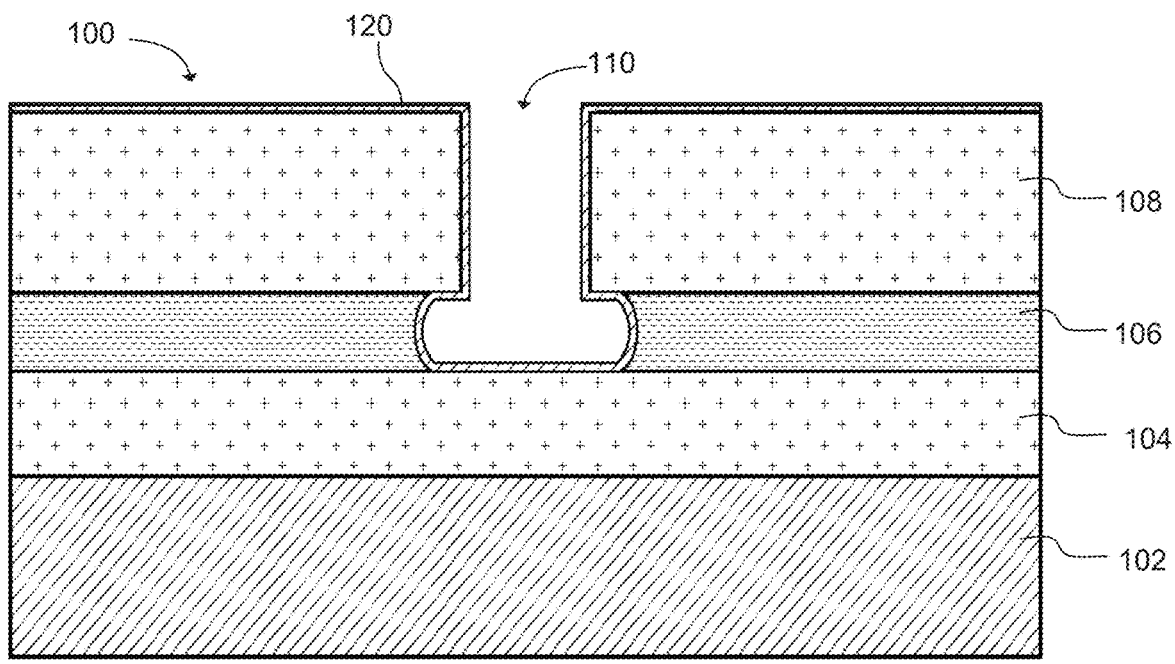
FIG. 4 illustrates a flash memory cell or flash memory structure at another point during fabrication thereof, in accordance with an example.

In some additional examples, as illustrated in FIG. 4, a protective liner 120 can be formed within the plug trench. In some examples, the protective liner 120 can also be formed on an upper surface of the SGS layer 108. The protective liner 120 can include any suitable protective liner, such as an oxide liner, a nitride liner, or a combination thereof. In some examples, the protective liner can be a high aspect ratio process (HARP) liner. A variety of suitable HARP liners can be used. In some specific examples, the HARP liner can be a tetraethyleneorthosilicate (TEOS) liner. The protective liner can have a variety of thicknesses. In some examples, the protective liner can have a thickness of from about 6 nm to about 15 nm, or from about 8 nm to about 12 nm.

Figure 5:
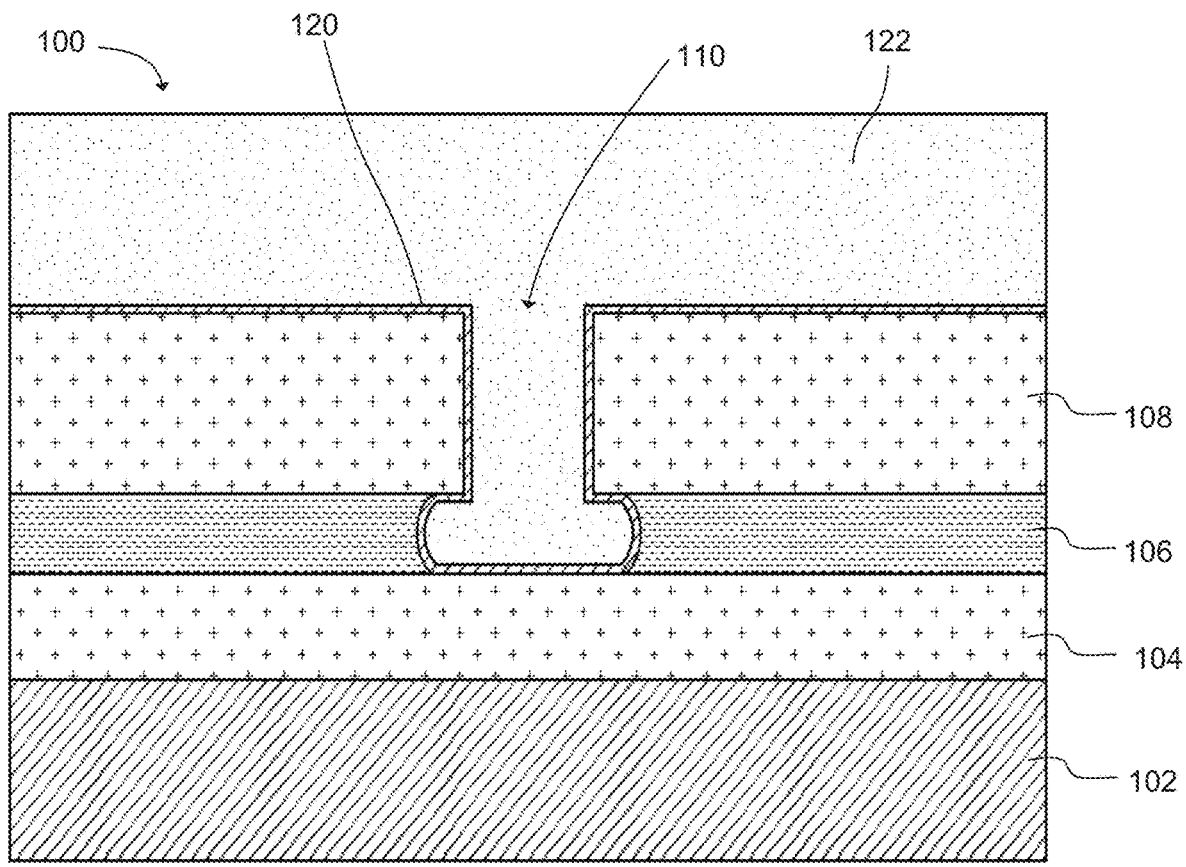
FIG. 5 illustrates a flash memory cell or flash memory structure at another point during fabrication thereof, in accordance with an example.

As illustrated in FIG. 5, a plug material 122 can be deposited in the plug trench 110. The plug material 122 can be deposited using any suitable methodology, such as chemical vapor deposition (CVD), physical vapor deposition (PVD), atomic layer deposition (ALD), the like, or a combination thereof. As illustrated in FIG. 5, the plug material 122 can also be deposited on an upper surface of the SGS layer 108, which can be done by either directly depositing the plug material 122 on an upper surface of the SGS layer 108 or by depositing the plug material 122 on an intervening layer, such as protective liner 120. Where a portion of the plug material 122 is deposited on an upper surface of the SGS layer 108, the portion can be removed from the upper surface of the SGS layer via chemical mechanical planarization (CMP) or other suitable process. In some examples, the CMP process can also remove a portion of the protective liner 120 that was deposited on the surface of the SGS layer 108.

Figure 6:
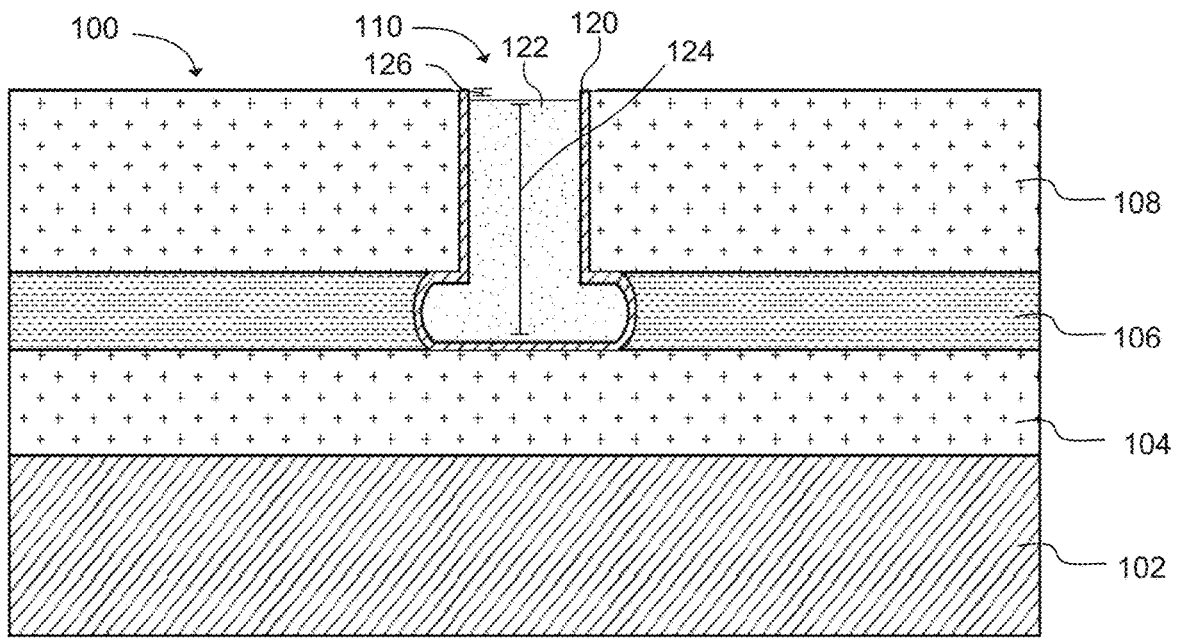
FIG. 6 illustrates a flash memory cell or flash memory structure at another point during fabrication thereof, in accordance with an example.

FIG. 6 illustrates an example of a flash memory stack 100 after the portion of the plug material 122 deposited on the upper surface of the SGS layer 108 has been removed, but where the plug material 122 within the plug trench 110 remains. It is noted that the thickness 124 of the plug 122 can vary depending on the particular material being employed and the height of the subsequently formed plurality of alternating layers of conductive material and insulating material (See FIG. 7). As such, the thickness 124 of the plug 122 can generally be about or at least about 5 nm to about 50 nm for every micrometer of thickness of the plurality of alternating layers of conductive material and insulating material. In other examples, the thickness 124 of the plug 122 can be about or at least about 10 nm to about 30 nm for every micrometer of thickness of the plurality of alternating layers of conductive material and insulating material.

It is also noted that in some cases an upper surface of the plug 122 may not be planar with an upper surface of the SGS layer 108. For example, in some cases, the CMP process employed to remove plug material from the upper surface of the SGS layer 108 can result in a slight difference between the upper surface of the SGS layer 108 and the upper surface of the plug 122. This can cause subsequently formed layers to have a non-planar topology. As such, the upper surface of the plug 122 can generally be within a distance 126 of about 10 nm from the upper surface of the SGS layer 108. In still other examples, the upper surface of the plug 122 can be within a distance 126 of about 5 nm from the upper surface of the SGS layer 108. This can help minimize irregular topologies of subsequently formed layers.

The plug 122 can be formed of a variety of materials. Generally, the plug 122 can include any material that can act as a dry etch stop layer (e.g. high selectivity to serve as a stop layer during pillar etch), that has good deposition capability (e.g. CVD, PVD, diffusion, etc.), that is polishable by CMP with good selectivity to holding the plug while conserving the plug material, and that is etchable by a wet etch process to allow plug removal after pillar trench formation. The plug material can include metals, dielectrics, metal dielectrics, alloys, polymers, composites, or the like. Some non-limiting examples of plug materials can include $Al_xO_x$, Ta, $Ta_2O_5$, TaN, $ZrO_x$, $HfO_x$, W, the like, or a combination thereof. In some specific examples, the plug material can be $Al_xO_x$.

Figure 7:
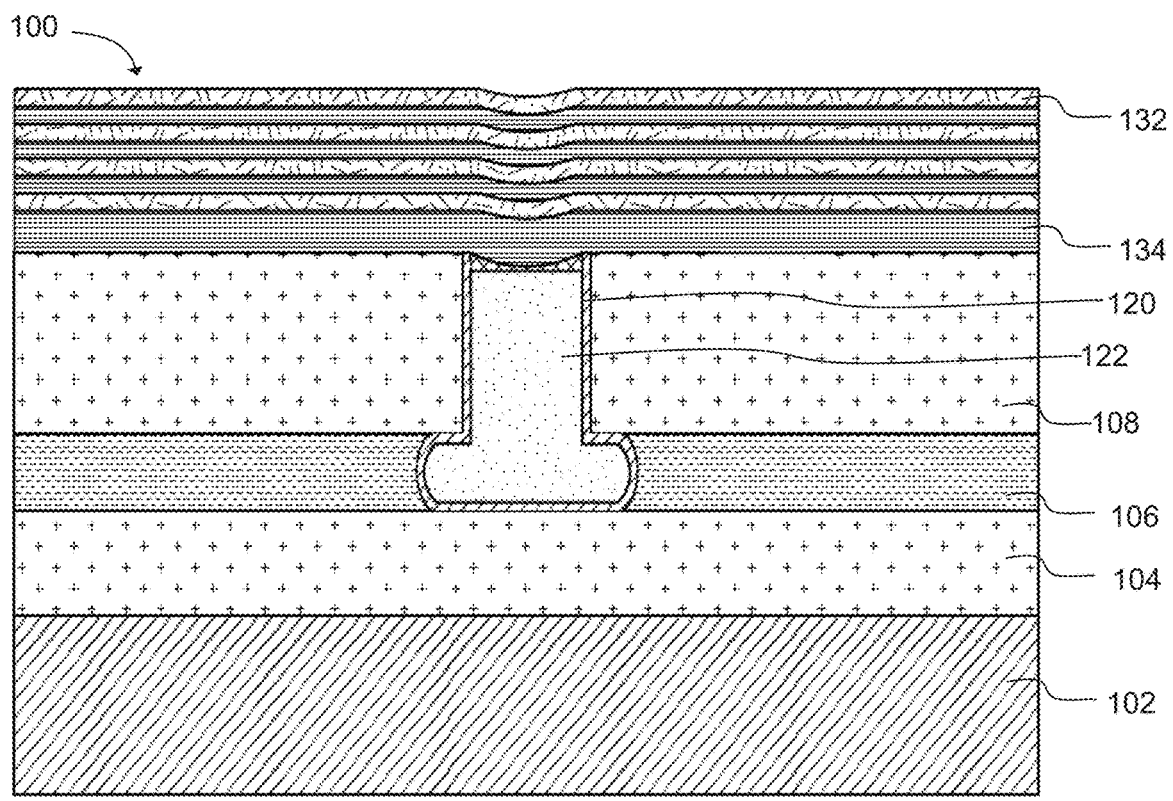
FIG. 7 illustrates a flash memory cell or flash memory structure at another point during fabrication thereof, in accordance with an example.
Figure 8:
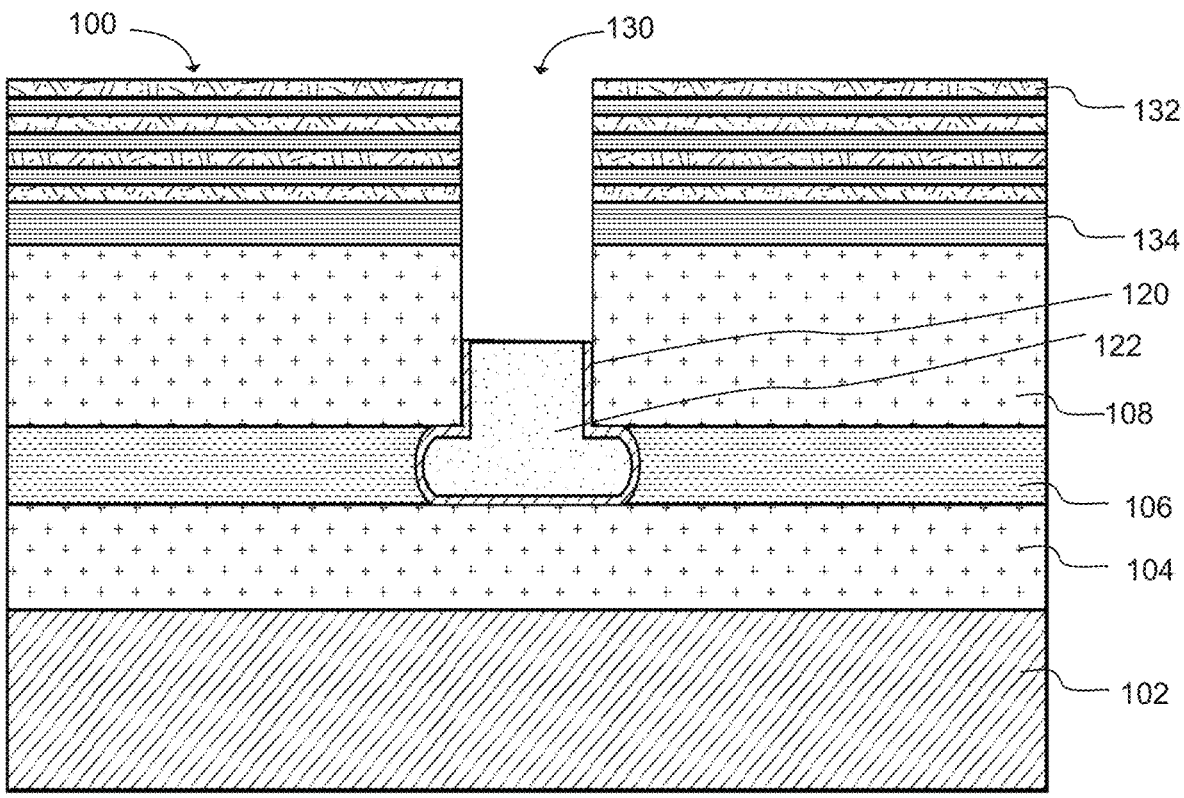
FIG. 8 illustrates a flash memory cell or flash memory structure at another point during fabrication thereof, in accordance with an example.
Figure 9:
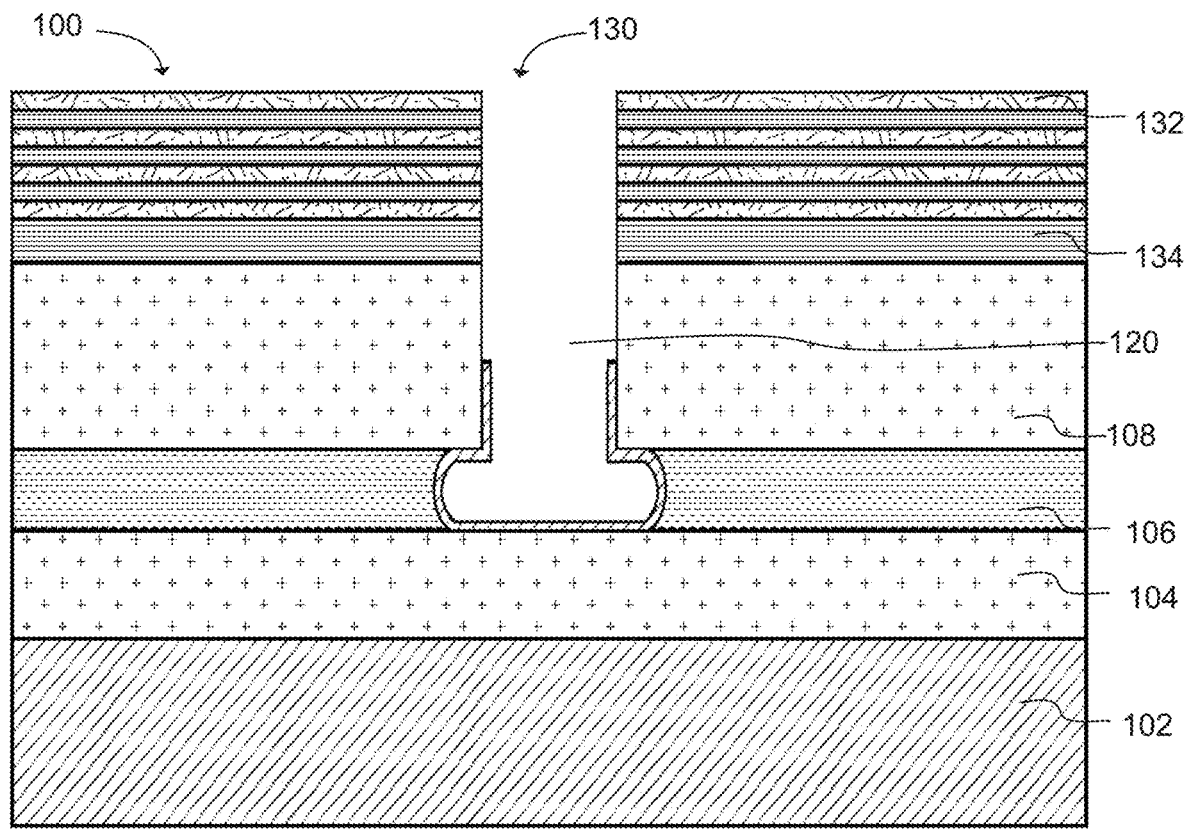
FIG. 9 illustrates a flash memory cell or flash memory structure at another point during fabrication thereof, in accordance with an example.

As illustrated in FIG. 7, a plurality of alternating layers of conductive material 132 and insulating material 134 can be formed on the SGS layer 108. As illustrated in FIG. 8, a cell pillar trench 130 can be etched through a region of the plurality of alternating layers to impinge on the plug 122. The cell pillar trench 130 can generally be formed via a dry etching process. As illustrated in FIG. 9, once the cell pillar trench 140 is formed, the plug 122 can be removed. This can typically be performed via a wet etching process. Depending on the plug material employed, a variety of wet etchants can be used to remove the plug. Non-limiting examples can include hydrofluoric acid, nitric acid, acetic acid, the like, or combinations thereof. In some examples, the wet etchant can include hydrofluoric acid, such as dilute hydrofluoric acid. Once the plug material 122 is removed from the plug trench 110, the plug trench 110 can become part of the cell pillar trench 130.

Figure 10:
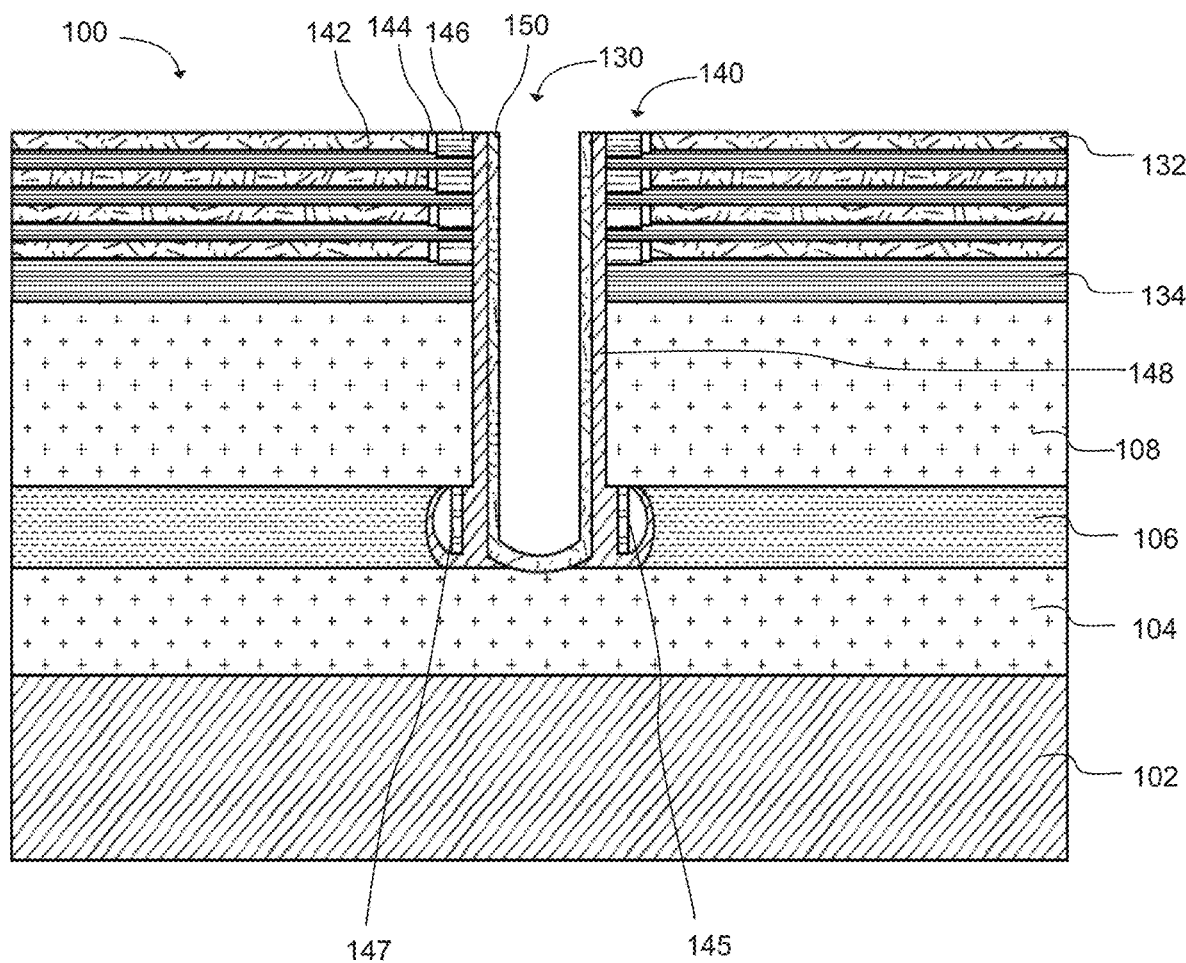
FIG. 10 illustrates a flash memory cell or flash memory structure at another point during fabrication thereof, in accordance with an example.

While subsequent process steps are not illustrated in detail, FIG. 10 illustrates a flash memory stack 100 that includes an array of memory structures 140 arranged in a three-dimensional configuration around a conductive channel 150, wherein the memory structures 140 are aligned with and electrically coupled to the conductive material layers 132.

In further detail, floating gate recesses can be formed in the conductive layers 132 of the plurality of alternating layers. An interpoly dielectric (IPD) layer 144 can be formed within individual floating gate recesses. The IPD layer 144 can be made of any known material useful for such a material. In one aspect, the IPD layer 144 can be a layered structure comprised of a silicon nitride layer disposed between two layers of silicon oxide. This tri-layer is referred to as an "ONO" or "Oxide-Nitride-Oxide" layer. Note that the IPD layer is 144 positioned to electrically isolate materials subsequently deposited into the floating gate recess from the portion 142 of the conducting material layer 132. In some examples, portion 142 can include or form a control gate (e.g. word line or "WL"). In some examples, residual IPD material 145 can be collected at the bottom of the cell pillar trench 130 in the lateral recess 112.

A floating gate layer (or material) 146 can be deposited on the IPD layer 144. Thus, the floating gate material 146 in the floating gate recess is surrounded on at least three sides by an insulating material. In some examples, the IPD layer 144 can "wrap around" the floating gate material 146 in the floating gate recess to differing degrees depending on the architecture of the device. It is noted that the floating gate material 146 can be any material useful in creating a floating gate. In one specific aspect, the floating gate material 146 can be polysilicon. In some examples, residual floating gate material 147 can be collected at the bottom of the cell pillar trench 140 in the lateral recess 112.

A tunnel dielectric (i.e. tunnel oxide) layer 148 can then be formed along the sidewalls of the trench. Tunnel dielectrics are well known, and can be any insulating material that functions as a tunnel dielectric. Non-limiting examples can include oxides and nitrides such as $SiO_2$, SiON, and the like. In one aspect, the tunnel dielectric can be an oxide that has been treated to allow uniform growth on metal materials. In one specific aspect the tunnel dialectic can be a DEP poly liner (30 A) that has been in situ steam generation (ISSG) oxidized. The protective liner 120 can generally form part of the tunnel dielectric layer 148. Following formation of the tunnel dielectric 148, a liner layer (not shown) can be formed on the tunnel dialectic and the bottom of the cell pillar trench 130 can be punch-etched through the liner layer and the tunnel dielectric 148 to expose the source layer 104. A conductive channel 150 can subsequently be formed in the cell pillar trench 130. The conductive channel 150 can be deposited, epitaxially grown, or otherwise formed within the cell pillar trench 130. In one non-limiting aspect, the conductive channel 150 can be a polysilicon material. In some examples, the conductive channel can fill the remainder of the cell pillar trench 130. In other examples, the conductive channel 150 can form a layer within the cell pillar trench 130 and the remainder of the cell pillar trench 130 can be filled in with a dielectric material, such as an oxide material.

As described above, the fabrication processes described herein can be used to fabricate a flash memory cell or flash memory structure where the source layer and the SGS layer can be positioned relatively proximate to one another and where the pillar trench has a uniform or substantially uniform diameter. For example, the memory cells and memory structures described herein can typically have a cell pillar trench having a diameter that differs by no more than 20% along a length thereof from the drain end to the SGS end of the plurality of alternating layers. With reference to FIG. 10, the drain end of the plurality of alternating layers would be the upper most end of the plurality of layers (e.g. top of layer labeled 132) and the SGS end would be the end closest to the SGS layer (e.g. bottom of layer labeled 134). In some further examples, the diameter of the cell pillar trench can differ by no more than 15%, 10%, or 5% along a length thereof from the drain end to the SGS end of the plurality of alternating layers. In some examples, the diameter of the cell pillar trench can differ by no more than 15 nanometers (nm) along a length thereof from the drain end to the SGS end of the plurality of alternating layers. In still other examples, the diameter of the cell pillar trench can differ by no more than 12 nm, 10 nm, or 8 nm along a length thereof from the drain end to the SGS end of the plurality of alternating layers. In yet additional examples, the diameter of the cell pillar trench can differ by no more than 20%, 15%, 10%, or 5% along a length thereof from the top of the SGS layer to the bottom of the SGS layer. In some examples, the diameter of the cell pillar trench can differ by no more than 15 nm along a length thereof from the top of the SGS layer to the bottom of the SGS layer. In still other examples, the diameter of the cell pillar trench can differ by no more than 12 nm, 10 nm, or 8 nm along a length thereof from the top of the SGS layer to the bottom of the SGS layer.

In some specific examples, the diameter of the cell pillar trench along a length thereof from the drain end to the SGS end of the plurality of alternating layers can be from about 65 nm to about 95 nm, or from about 70 nm to about 90 nm. In some further examples, the diameter of the cell pillar trench along a length thereof from the top of the SGS layer to bottom of the SGS layer can be from about 85 nm to about 115 nm, or from about 90 nm to about 110 nm. However, in some cases, the diameter of the cell pillar trench can also depend on other features of the memory cell or memory structure. Thus, in some examples, the diameter of the cell pillar can be related to other features of the memory cell or memory structure. For example, in some cases, the diameter of the cell pillar trench at the top of the SGS layer can be from about 1.25 times to about 3.5 times the thickness of the dielectric layer. In other examples, the diameter of the cell pillar trench at the top of the SGS layer can be from about 1.5 times to about 2.5 times the thickness of the dielectric layer.

As described above, it can be desirable to maintain the source line and the SGS layer in relatively close proximity. Thus, it can also be desirable that the dielectric layer between the source layer and the SGS layer be relatively thin. For example, in some cases, the dielectric layer can have a thickness that is less than or equal to the thickness of the source layer. In some additional examples, the thickness of the SGS layer can be from about 2 times to about 5 times the thickness of the dielectric layer. In still other examples, the thickness of the SGS layer can be from about 2.5 times to about 3.5 times the thickness of the dielectric layer. In some specific examples, the dielectric layer can have a thickness of from about 30 nm to about 70 nm, or from about 40 nm to about 60 nm.

The dielectric layer can be made of or include a variety of dielectric materials. For example, in some cases, the dielectric layer can be made of or include an oxide layer, a nitride layer, a combination of oxide and nitride layers or materials, the like, or a combination thereof. In some examples, the dielectric layer can include an aluminum oxide, silicon oxide, the like, or a combination thereof.

The source layer can be a layer comprised of any useful conductive material, such as a semiconductor, metal, or the like, including combinations and mixtures thereof. In one embodiment, the source layer can comprise a doped or heavily doped silicon, such as, for example, polysilicon. In another embodiment, the source layer can comprise a silicide, including salicides, polycides, or the like. In one specific embodiment, the source layer can comprise $WSi_x$. The source layer can additionally be a layer of conductive and nonconductive regions forming source lines of a memory array.

The SGS layer can be a MOSFET select gate or other suitable select gate for coupling the source layer to a plurality of alternating layers of conductive material and insulating material. The SGS layer can be electrically isolated from the source layer by the dielectric layer.

The conductive channel can be comprised of any suitable conductor or semiconductor material, which can include a single or multiple different materials. Non-limiting examples can include silicon, polysilicon, gallium, gallium arsenide, and the like, including combinations thereof. In some embodiments, the conductive channel can comprise a semiconductor material. In other embodiments, the semiconductor material can also be doped, such as P-type doped, or N-type doped. In some embodiments, the conductive channel can comprise a conductive metal, metal mixture, metal alloy, or the like.

A flash memory structure is also described herein. The flash memory structure can include any of the features described herein with respect to the 3D NAND memory cell. Additionally, the flash memory structure can also include an array of memory structures arranged in a three-dimensional configuration around the conductive channel. The memory structure can be aligned with and electrically coupled to the conductive material layers.

A memory structure can generally include a floating gate that is electrically isolated from a supporting semiconductor substrate by a thin dielectric layer called a tunnel dielectric layer (i.e. tunnel oxide layer). A conductive material (i.e. a control gate) is positioned adjacent to the floating gate and electrically isolated therefrom by an inter-poly dielectric (IPD) layer. The inter-poly dielectric can be a layered structure, and in some aspects can include a silicon nitride layer sandwiched between two layers of silicon oxide. The floating gate is generally comprised of a conductive material that serves as a charge storage element for electrical charge. This charge storage element defines the memory state of the particular transistor to which it is associated. The floating gate is electrically isolated from surrounding conductive materials, and thus charge stored therein remains even when power to the device is discontinued. Thus, in some examples, individual memory structures of the array of memory structures can include a control gate, a charge storage structure (e.g. floating gate), a blocking dielectric disposed between the charge storage structure and the control gate, or a combination thereof.

In some additional examples, the flash memory structure can include a select gate drain (SGD) layer disposed on the drain end of the plurality of alternating layers of conducting material and insulating material. The SGD layer can be formed on an insulating layer on the top of or that forms the top of the plurality of alternating layers of conducting material and insulating material. The SGD layer can comprise a MOSFET select gate or other suitable select gate for coupling the array of memory structures to a data line, such as a bit line (BL).

In some additional examples, the flash memory structure can include a tunnel dielectric layer between the conductive channel and the array of memory structures. As described above, the tunnel dielectric layer can electrically isolate the floating gate from a conductive channel or other conductive material. Tunnel dielectrics are well known, and can be any insulating material that functions as a tunnel dielectric. Non-limiting examples can include oxides and nitrides such as $SiO_2$, SiON, and the like. In one aspect, the tunnel dielectric can be an oxide that has been treated to allow uniform growth on metal materials. In one specific aspect, the tunnel dialectic can be a DEP poly liner (30 A) that has been in situ steam generation (ISSG) oxidized.

The flash memory structure can comprise a number of suitable structures, such as a USB drive, a memory card, a solid-state drive, or the like. In some examples, the flash memory structure can be included in a computing system.

Figure 11:
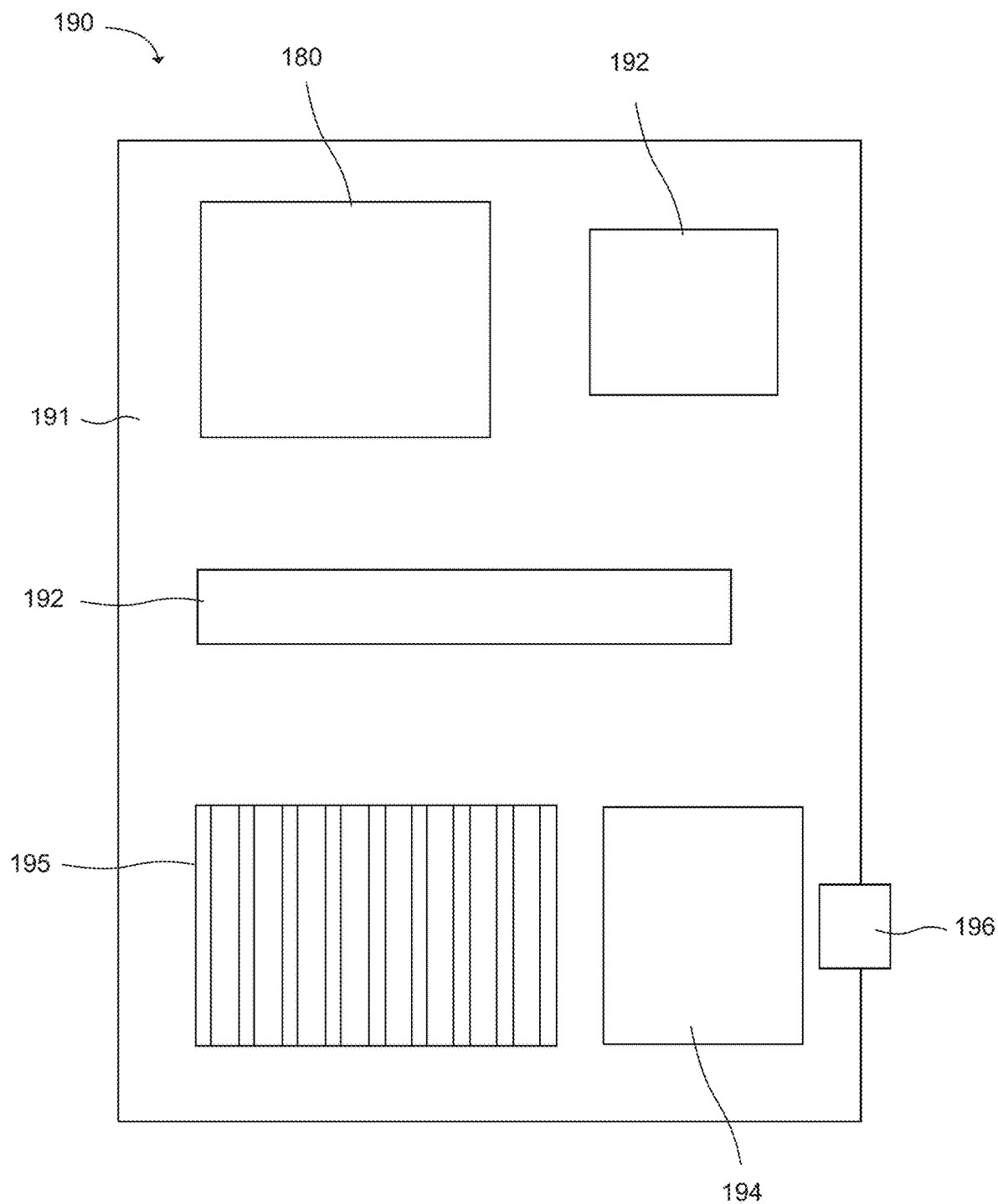
FIG. 11 illustrates a computing system, in accordance with an example.

A computing system can include a motherboard and a flash memory structure as described herein that is operably coupled to the motherboard. In one aspect, the computing system 190 can also include a processor 192, a memory device 193, a radio 194, a heat sink 195, a port 196, a slot, or any other suitable device or component, which can be operably coupled to the motherboard 191. The computing system 190 can comprise any type of computing system, such as a desktop computer, a laptop computer, a tablet computer, a smartphone, a wearable device, a server, etc. Other embodiments need not include all of the features specified in FIG. 11, and may include alternative features not specified in FIG. 11.

Circuitry used in electronic components or devices (e.g. a die) of a flash memory structure can include hardware, firmware, program code, executable code, computer instructions, and/or software. Electronic components and devices can include a non-transitory computer readable storage medium which can be a computer readable storage medium that does not include signal. In the case of program code execution on programmable computers, the computing systems recited herein may include a processor, a storage medium readable by the processor (including volatile and non-volatile memory and/or storage elements), at least one input device, and at least one output device. Volatile and non-volatile memory and/or storage elements may be a RAM, EPROM, flash drive, optical drive, magnetic hard drive, solid state drive, or other medium for storing electronic data. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

EXAMPLES

In some examples, a 3D NAND memory cell can include:
a source layer;
a dielectric layer disposed on the source layer;
a select gate source (SGS) layer disposed on the dielectric layer;
a plurality of alternating layers of conducting material and insulating material disposed on the SGS layer, said plurality of alternating layers having an SGS end proximate the SGS layer and a drain end distal to the SGS layer; and
a conductive channel formed within a cell pillar trench, said conductive channel being in contact with the source layer and the plurality of alternating layers, said cell pillar trench positioned in a substantially perpendicular orientation with respect to the plurality of alternating layers and having a diameter that differs by no more than 20% along a length thereof from the drain end to the SGS end of the plurality of alternating layers.

In some examples, the diameter differs by no more than 15%.

In some examples, the diameter differs by no more than 10%.

In some examples, the diameter differs by no more than 5%.

In some examples, the diameter differs by no more than 15 nanometers (nm).

In some examples, the diameter differs by no more than 12 nm.

In some examples, the diameter differs by no more than 10 nm.

In some examples, the diameter differs by no more than 8 nm.

In some examples, the diameter is from about 85 nm to about 115 nm.

In some examples, the diameter is from about 90 nm to about 110 nm.

In some examples, the diameter of the cell pillar trench at the top of the SGS layer is from about 1.25 times to about 3.5 times the thickness of the dielectric layer.

In some examples, the diameter of the cell pillar trench at the top of the SGS layer is from about 1.5 times to about 2.5 times the thickness of the dielectric layer.

In some examples, the thickness of the SGS layer is from about 2 times to about 5 times the thickness of the dielectric layer.

In some examples, the thickness of the SGS layer is from about 2.5 times to about 3.5 times the thickness of the dielectric layer.

In some examples, the thickness of the dielectric layer is less than or equal to the thickness of the source layer.

In some examples, the thickness of the dielectric layer is from about 30 nm to about 70 nm.

In some examples, the thickness of the dielectric layer is from about 40 nm to about 60 nm.

In some examples, the dielectric layer is an oxide layer.

In some examples, the conductive channel comprises a doped polysilicon material.

In some examples, the conductive channel is P-type doped.

In some examples, the conductive channel is N-type doped.

In some examples, a flash memory structure can include:
a source layer;
a dielectric layer disposed on the source layer;
a select gate source (SGS) layer disposed on the dielectric layer;
a plurality of alternating layers of conducting material and insulating material disposed on the SGS layer, said plurality of alternating layers having an SGS end proximate the SGS layer and a drain end distal to the SGS layer;
a conductive channel formed within a cell pillar trench, said conductive channel being in contact with the source layer and the plurality of alternating layers, said cell pillar trench positioned in a substantially perpendicular orientation with respect to the plurality of alternating layers and having a diameter that differs by no more than 20% along a length thereof from the drain end to the SGS end of the plurality of alternating layers; and
an array of memory structures arranged in a three-dimensional configuration around the conductive channel, wherein the memory structures are aligned with and electrically coupled to the conductive material layers.

In some examples, the diameter differs by no more than 15%.

In some examples, the diameter differs by no more than 15 nanometers (nm).

In some examples, the diameter is from about 85 nm to about 115 nm.

In some examples, the diameter of the cell pillar at the top of the SGS layer is from about 1.25 times to about 3.5 times the thickness of the dielectric layer.

In some examples, the thickness of the SGS layer is from about 2 times to about 5 times the thickness of the dielectric layer.

In some examples, the thickness of the dielectric layer is less than or equal to the thickness of the source layer.

In some examples, the thickness of the dielectric layer is from about 30 nm to about 70 nm.

In some examples, the dielectric layer is an oxide layer.

In some examples, the SGS layer, the dielectric layer, or both comprises residual etch-stop material at a region of the respective layer proximate the cell pillar.

In some examples, the flash memory structure can further include a select gate drain (SGD) layer disposed on the drain end of the plurality of alternating layers.

In some examples, the conductive channel is in contact with the SGD layer.

In some examples, the flash memory structure can further include a data line connected to the SGD layer.

In some examples, the conductive channel comprises a doped polysilicon material.

In some examples, the conductive channel is P-type doped.

In some examples, the conductive channel is N-type doped.

In some examples, the flash memory structure can further include a tunnel dielectric layer between the conductive channel and the array of memory structures.

In some examples, individual memory structures of the array of memory structures comprise a control gate, a charge storage structure, and a blocking dielectric disposed between the charge storage structure and the control gate.

In some examples, the flash memory structure comprises a USB drive, a memory card, or a solid-state drive.

In some examples, a computing system can include:
a motherboard; and
a flash memory structure as described herein operably coupled to the motherboard.

In some examples, the computing system comprises a desktop computer, a laptop computer, a tablet, a smartphone, a wearable device, a server, or a combination thereof.

In some examples, the computing system comprises a processor, a memory device, a heat sink, a radio, a slot, a port, or a combination thereof operably coupled to the motherboard.

In some examples, a method of fabricating a 3D NAND memory cell can include:
forming a source layer, a dielectric layer on the source layer, and a select gate source (SGS) layer on the dielectric layer;
forming a plug trench through a region of the SGS layer and the dielectric layer;
depositing an etch-stop material within the plug trench to form a plug;
forming a plurality of alternating layers of conductive material and insulating material on the SGS layer;
etching a cell pillar trench through a region of the plurality of alternating layers to impinge on the plug;
removing the plug from the plug trench; and
forming a conductive channel contacting the source layer and the plurality of alternating layers.

In some examples, forming the plug trench comprises dry etching.

In some examples, the method can further include forming a lateral recess extending laterally from a trench wall of the SGS layer within the dielectric layer.

In some examples, the lateral recess extends from the trench wall into the dielectric layer a distance that is about 0.2 times to about 0.6 times the thickness of the dielectric layer.

In some examples, the lateral recess extends from the trench wall into the dielectric layer a distance that is about 0.3 times to about 0.4 times the thickness of the dielectric layer.

In some examples, the lateral recess extends from the trench wall into the dielectric layer a distance of from about 15 nm to about 20 nm.

In some examples, forming the lateral recess comprises wet etching.

In some examples, the method can further include forming a protective liner within the plug trench.

In some examples, the protective liner is a high aspect ratio process (HARP) liner.

In some examples, the HARP liner has a thickness of from about 8 nm to about 12 nm.

In some examples, the protective liner is a tetraethylorthosilicate (TEOS) liner.

In some examples, the plug has a thickness of from about 5 nm to about 50 nm for every micrometer of thickness of the plurality of alternating layers.

In some examples, the plug has a thickness of from about 10 nm to about 30 nm for every micrometer of thickness of the plurality of alternating layers.

In some examples, the plug is formed via chemical vapor deposition (CVD), physical vapor deposition (PVD), atomic layer deposition (ALD), or a combination thereof.

In some examples, a portion of the etch-stop material is deposited on an upper surface of the SGS layer.

In some examples, the portion is removed from the upper surface of the SGS layer via chemical mechanical planarization (CMP).

In some examples, an upper surface of the plug is within a distance of 10 nm from an upper surface of the SGS layer.

In some examples, an upper surface of the plug is within a distance of 5 nm from an upper surface of the SGS layer.

In some examples, wherein the plug comprises $Al_xO_x$, Ta, $Ta_2O_5$, TaN, $ZrO_x$, $HfO_x$, W, or a combination thereof.

In some examples, the plug comprises $Al_xO_x$.

In some examples, the thickness of the SGS layer is from about 2 times to about 5 times the thickness of the dielectric layer.

In some examples, the thickness of the dielectric layer is less than or equal to the thickness of the source layer.

In some examples, the thickness of the dielectric layer is from about 30 nm to about 70 nm.

In some examples, the dielectric layer is an oxide layer.

In some examples, forming the cell pillar trench comprises dry etching.

In some examples, removing the plug is comprises wet etching.

In some examples, forming the conductive channel comprises a deposition process, an epitaxial growth process, or a combination thereof.

In some examples, a method of maintaining a uniform cell pillar trench diameter in a 3D NAND memory cell can include:

forming a source layer, a dielectric layer on the source layer, and a select gate source (SGS) layer on the dielectric layer;

forming a plug trench through a region of the SGS layer and the dielectric layer;

depositing an etch-stop material within the plug trench to form a plug;

forming a plurality of alternating layers of conductive material and insulating material on the SGS layer, said plurality of alternating layers having an SGS end proximate the SGS layer and a drain end distal to the SGS layer;

etching a cell pillar trench through a region of the plurality of alternating layers to impinge on the plug, said cell pillar trench being positioned in a substantially perpendicular orientation with respect to the plurality of alternating layers and having a diameter that differs by no more than 20% along a length thereof from the drain end to the SGS end of the plurality of alternating layers; and removing the plug from the plug trench.

In some examples, the diameter differs by no more than 15%.

In some examples, the diameter differs by no more than 15 nm.

In some examples, the diameter is from about 85 nm to about 115 nm.

In some examples, the diameter of the cell pillar at the top of the SGS layer is from about 1.25 times to about 3.5 times the thickness of the dielectric layer.

In some examples, forming the plug trench comprises dry etching.

In some examples, the method can further include forming a lateral recess extending from the plug trench within the dielectric layer.

In some examples, the lateral recess extends from the plug trench into the dielectric layer a distance that is about 0.2 times to about 0.6 times the thickness of the dielectric layer.

In some examples, the lateral recess extends from the plug trench into the dielectric layer a distance that is about 0.3 times to about 0.4 times the thickness of the dielectric layer.

In some examples, the lateral recess extends from the plug trench into the dielectric layer a distance of from about 15 nm to about 20 nm.

In some examples, forming the lateral recess comprises wet etching.

In some examples, the method can further include forming a protective liner within the plug trench.

In some examples, the protective liner is a high aspect ratio process (HARP) liner.

In some examples, the HARP liner has a thickness of from about 8 nm to about 12 nm.

In some examples, the protective liner is a tetraethylorthosilicate (TEOS) liner.

In some examples, the plug has a thickness of from about 0.5 nm to about 3 nm for every micrometer of thickness of the plurality of alternating layers.

In some examples, the plug has a thickness of from about 1 nm to about 2 nm for every micrometer of thickness of the plurality of alternating layers.

In some examples, the plug is formed via chemical vapor deposition (CVD), physical vapor deposition (PVD), atomic layer deposition (ALD), or a combination thereof.

In some examples, a portion of the etch-stop material is deposited on an upper surface of the SGS layer.

In some examples, the portion is removed from the upper surface of the SGS layer via chemical mechanical planarization (CMP).

In some examples, an upper surface of the plug is within 10 nm of being planar with an upper surface of the SGS layer.

In some examples, an upper surface of the plug is within 5 nm of being planar with an upper surface of the SGS layer.

In some examples, the plug comprises $Al_xO_x$, Ta, $Ta_2O_5$, TaN, $ZrO_x$, $HfO_x$, W, or a combination thereof.

In some examples, the plug comprises $Al_xO_x$.

In some examples, the dielectric layer is an oxide layer.

In some examples, forming the cell pillar trench comprises dry etching.

In some examples, removing the plug is comprises wet etching.

While the forgoing examples are illustrative of the specific embodiments in one or more particular applications, it will be apparent to those of ordinary skill in the art that numerous modifications in form, usage and details of implementation can be made without departing from the principles and concepts articulated herein. Accordingly, no limitation is intended except as by the claims set forth below.

What is claimed is:

1. A 3D NAND memory cell, comprising:
a source layer;
a dielectric layer disposed on the source layer;
a select gate source (SGS) layer disposed on the dielectric layer, wherein the thickness of the SGS layer is from about 2 times to about 5 times the thickness of the dielectric layer;
a plurality of alternating layers of conducting material and insulating material disposed on the SGS layer, said plurality of alternating layers having an SGS end proximate the SGS layer and a drain end distal to the SGS layer;
a tunnel dielectric layer formed within a cell pillar trench and extending along a sidewall of the cell pillar trench and laterally within the dielectric layer at least partially between the SGS layer and the source layer; and
a conductive channel formed within the cell pillar trench, said conductive channel connecting the source layer and the plurality of alternating layers, said cell pillar trench positioned in a substantially perpendicular orientation with respect to the plurality of alternating layers and having a diameter that differs by no more than 20% along a length thereof from the drain end to the SGS end of the plurality of alternating layers.

2. The memory cell of claim 1, wherein the diameter differs by no more than 15%.

3. The memory cell of claim 1, wherein the diameter differs by no more than 15 nanometers (nm).

4. The memory cell of claim 1, wherein the diameter is from about 85 nm to about 115 nm.

5. The memory cell of claim 1, wherein the diameter of the cell pillar trench at the SGS end is from about 1.25 times to about 3.5 times the thickness of the dielectric layer.

6. The memory cell of claim 1, wherein the thickness of the dielectric layer is from about 30 nm to about 70 nm.

7. The memory cell of claim 1, wherein the dielectric layer is an oxide layer.

8. The memory cell of claim 1, wherein the conductive channel comprises a doped polysilicon material.

9. The memory cell of claim 8, wherein the conductive channel is P-type doped.

10. The memory cell of claim 8, wherein the conductive channel is N-type doped.

11. A flash memory structure, comprising:
a source layer;
a dielectric layer disposed on the source layer;
a select gate source (SGS) layer disposed on the dielectric layer, wherein the thickness of the SGS layer is from about 2 times to about 5 times the thickness of the dielectric layer;
a plurality of alternating layers of conducting material and insulating material disposed on the SGS layer, said plurality of alternating layers having an SGS end proximate the SGS layer and a drain end distal to the SGS layer;
a tunnel dielectric layer formed within a cell pillar trench and extending along a sidewall of the cell pillar trench and laterally within the dielectric layer at least partially between the SGS layer and the source layer;
a conductive channel formed within the cell pillar trench, said conductive channel connecting the source layer and the plurality of alternating layers, said cell pillar trench positioned in a substantially perpendicular orientation with respect to the plurality of alternating layers and having a diameter that differs by no more than 20% along a length thereof from the drain end to the SGS end of the plurality of alternating layers; and
an array of memory structures arranged in a three-dimensional configuration around the conductive channel, wherein the memory structures are aligned with and electrically coupled to the conductive material layers.

12. The flash memory structure of claim 11, wherein the diameter differs by no more than 15%.

13. The flash memory structure of claim 11, wherein the diameter differs by no more than 15 nanometers (nm).

14. The flash memory structure of claim 11, wherein the diameter is from about 85 nm to about 115 nm.

15. The flash memory structure of claim 11, wherein the diameter of the cell pillar at the SGS end is from about 1.25 times to about 3.5 times the thickness of the dielectric layer.

16. The flash memory structure of claim 11, wherein the thickness of the dielectric layer is from about 30 nm to about 70 nm.

17. The flash memory structure of claim 11, wherein the conductive channel comprises a doped polysilicon material.

18. The flash memory structure of claim 11, further comprising a tunnel dielectric layer between the conductive channel and the array of memory structures.

* * * * *